(12) United States Patent
Walke et al.

(10) Patent No.: US 11,721,373 B2
(45) Date of Patent: *Aug. 8, 2023

(54) SHARED MULTI-PORT MEMORY FROM SINGLE PORT

(71) Applicant: XILINX, INC., San Jose, CA (US)

(72) Inventors: Richard Lewis Walke, Edinburgh (GB); John Edward Mcgrath, Tipperary (IE)

(73) Assignee: XILINX, INC., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/750,297

(22) Filed: May 20, 2022

(65) Prior Publication Data
US 2023/0023866 A1    Jan. 26, 2023

Related U.S. Application Data

(63) Continuation of application No. 17/210,356, filed on Mar. 23, 2021, now Pat. No. 11,348,624.

(51) Int. Cl.
*G11C 7/10* (2006.01)
*G11C 8/16* (2006.01)

(52) U.S. Cl.
CPC .......... *G11C 7/1075* (2013.01); *G11C 7/1012* (2013.01); *G11C 7/1051* (2013.01); *G11C 7/1072* (2013.01); *G11C 7/1078* (2013.01); *G11C 8/16* (2013.01)

(58) Field of Classification Search
CPC ... G11C 7/1012; G11C 7/1051; G11C 7/1072; G11C 1/1075; G11C 1/1078; G11C 8/16
USPC ........................................ 365/189.04, 230.05
See application file for complete search history.

(56) References Cited

U.S. PATENT DOCUMENTS 6,259,648 B1    7/2001 Kragick
11,348,624 B1*  5/2022 Walke .................... G11C 7/106
2019/0361631 A1  11/2019 Yang et al.

OTHER PUBLICATIONS

Tarn, Helene, et al., "3GPP LTE Digital Front End Reference Design—XAPP1123", Oct. 29, 2008 (87 pages).

* cited by examiner

*Primary Examiner* — Son L Mai
(74) *Attorney, Agent, or Firm* — Patterson + Sheridan, LLP

(57) ABSTRACT

Embodiments herein describe a multi-port memory system that includes one or more single port memories (e.g., a memory that can perform only one read or one write at any given time, referred to as a 1W or 1R memory). That is, the multi-port memory system can perform multiple read and writes in parallel (e.g., 1R/1W, 1R/3W, 2R/2W, 3R/1W, etc.) even though the memory in the system can only perform one read or one write at any given time. The advantage of doing so is a reduction in area and power.

18 Claims, 7 Drawing Sheets

US 11,721,373 B2

SHARED MULTI-PORT MEMORY FROM SINGLE PORT

CROSS REFERENCE TO RELATED APPLICATION

This application is a Continuation Application of U.S. Non-Provisional application Ser. No. 17/210,356, filed on Mar. 23, 2021 of which is incorporated herein by reference in its entirety.

TECHNICAL FIELD

Examples of the present disclosure generally relate to a multi-port memory system (e.g., a system that can perform multiple reads and writes in parallel) that uses a single port memory (e.g., a memory element that can perform only a read or only a write at any given time).

BACKGROUND

Many applications require a memory to perform read and writes in parallel (e.g., multi-port memory systems). These systems typically include dual-ported memories (i.e., memories that perform at least one read and write in parallel) to implement large delay buffers and dynamic coefficient storage. In an application specific integrated circuit (ASIC), a dual-ported memory consumes more area and power per bit than single port memory (i.e., memories that can perform only a single read or a single write at any given time). Also, multiple independent small memories are inefficient in area when compared with a single large memory. Thus, there are large area and power advantages of replacing a multi-port memory (e.g., a two-port memory that can perform a read and write in parallel) with single port memories. Doing so can result in a 40% reduction in area for memory macros.

SUMMARY

One embodiment describes a multi-port memory system that includes a single port memory capable of performing only one read or one write at a time where an address space of the single port memory is half or less than the address space of the multi-port memory system, a divider configured to divide received read and write addresses, a first register coupled to a write data port of the single port memory and configured to store a received write data word when the single port memory is performing a read operation, and a second register coupled to a read data port of the single port memory and configured to store a first data word of a plurality of data words read from the single port memory during the read operation. Further, to a perspective of an external entity, the multi-port memory system performs at least one of (i) at least one read and at least one write operation in parallel or (ii) multiple reads or multiple writes in parallel using the single port memory.

Another embodiment described herein is a method that includes writing, during a first cycle, a first plurality of data words into the single port memory using a write data port, reading, during a second cycle, a second plurality of data words from a first memory address of the single port memory using a read data port, storing, during the second cycle, a first one of the second plurality of data words in a first register coupled to the read data port, outputting, during the second cycle, a second one of second plurality of data words as read data, storing, during the second cycle, a first received word in a second register coupled to a write data port of the single port memory, writing, during a third cycle, the first received word and a second received word into a second memory address of the single port memory using the write data port, and outputting, during the third cycle, the second one of the second plurality of data words as read data.

Another embodiment described herein is a multi-port memory system that includes a single port memory capable of performing only one read or one write at a time where a depth of the multi-port memory system is greater than the depth of the single port memory and a width of the multi-port memory system is less than a width of the single port memory, a first register coupled to a write data port of the single port memory and configured to store a received write data word when the single port memory is performing a read operation, and a second register coupled to a read data port of the single port memory and configured to store a first data word of a plurality of data words read from the single port memory during the read operation. Further, an access pattern corresponding to the multi-port system is sequential such that memory addresses used to perform read and write operations increment according to a fixed amount.

BRIEF DESCRIPTION OF DRAWINGS

So that the manner in which the above recited features can be understood in detail, amore particular description, briefly summarized above, may be had by reference to example implementations, some of which are illustrated in the appended drawings. It is to be noted, however, that the appended drawings illustrate only typical example implementations and are therefore not to be considered limiting of its scope.

DETAILED DESCRIPTION

Figure 1:
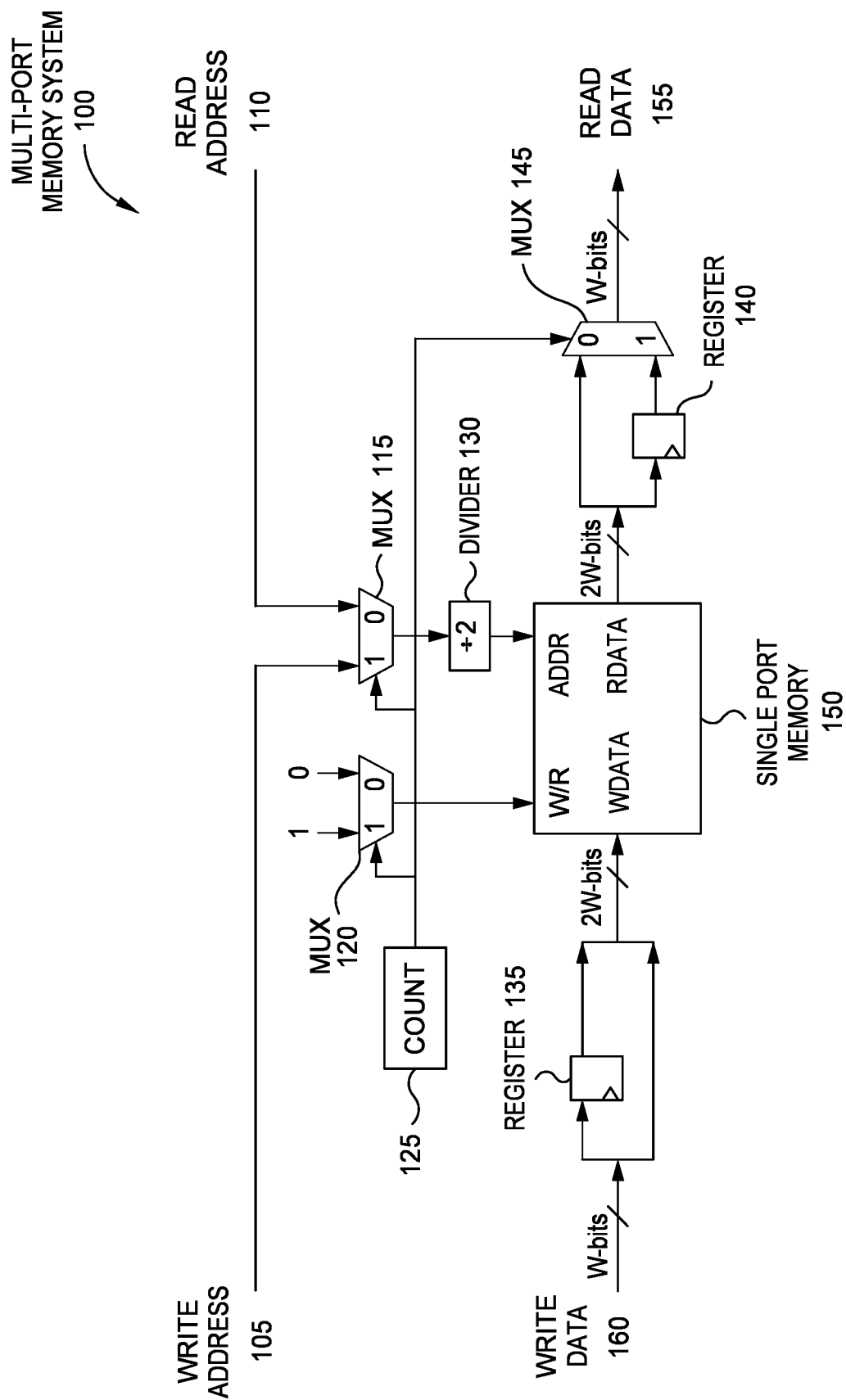
FIG. 1 is a diagram of a multi-port memory system implemented using a single port memory, according to an example.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the features or as a limitation on the scope of the claims. In addition, an illustrated example need not have all the aspects or advantages shown. An aspect or an advantage described in conjunction with a particular example is not necessarily limited to that example and can be practiced in any other examples even if not so illustrated, or if not so explicitly described.

Embodiments herein describe a multi-port memory system that includes one or more single port memories (e.g., a memory that can perform only one read or one write at any given time, referred to as a 1W or 1R memory). That is, the multi-port memory system can perform multiple read and writes in parallel (e.g., 1R/1W, 1R/3W, 2R/2W, 3R/1W, etc.) even though the memory in the system can only perform one read or one write at any given time. The multi-port system does not include any dual-port memories but relies solely on a single port memory. The advantage of doing so is a reduction in area and power.

In one embodiment, the single port memory includes a reduced depth (e.g., half the memory space) but stores multiple words at each address (e.g., twice the width) as a multi-port memory. Thus, when performing a write, the multi-port memory stores two data words at the same address in the single port memory. Further, when performing a read, the system retrieves two (or more) words from the same address. However, the system also includes a register for storing (or buffering) one of the words so that only one of the retrieved words is output on the current cycle, while the other retrieved word may be output on a subsequent cycle. In parallel, the multi-port memory system can receive, and buffer, a first word to be written into the single port memory. In the next cycle, the system can perform another write operation which writes the buffered word and a currently received word into the single port memory. As a result, each clock cycle the multi-port system can perform one word read and one word write in parallel. This can be used with any application where the access pattern of a given port is sequential or consistent (e.g., the memory address increments by one rather than randomly changing).

FIG. 1 is a diagram of a multi-port memory system 100 implemented using a single port memory 150, according to an example. To the perspective of an outside circuit (e.g., an external entity), the multi-port memory system 100 is a dual-port memory—e.g., a memory that can perform a read and write in parallel. However, the memory system 100 includes a single port memory 150 that can only perform one read or one write during any given clock cycle (i.e., a 1R or 1W memory). In one embodiment, the memory system 100 is implemented in an IC (e.g., a processor, ASIC, field programmable gate array, graphics processing unit, and the like).

As shown, the memory system 100 receives a write address 105, a read address 110, and write data 160 from an external circuit (e.g., a memory controller or processor). The memory system 100 uses a count 125 to switch between performing a write or a read on the single port memory 150. The count 125 may switch values every clock cycle (e.g., a high and low period) where during a first clock cycle, the count 125 causes the memory system 100 to write data into the single port memory 150 while during the next clock cycle the count causes the memory system 100 to read data from the single port memory 150.

To perform a write operation, the count 125 controls a multiplexer (mux) 120 so that a "1" is fed into the single port memory 150, instructing the memory 150 to write data received at its write data port (i.e., WDATA). As shown, the write data at the WDATA input port has 2 words (2W), rather than just a single data word. For example, a dual port memory may receive a single data word and write that word into a corresponding memory address. However, the single port memory 150 instead writes two words into each memory address. Thus, the single port memory 150 uses half the depth (e.g., half the memory address) as a dual port memory but has twice the width in order to store two words at each address.

Because the external circuitry does not know the multi-port memory system 100 uses a single port memory 150 instead of a dual port memory, it will provide one word to be written every clock cycle. However, the count 125 permits the memory system 100 to perform a write on every other cycle. Thus, the memory system 100 includes a register 135 for storing or buffering a data word that is received during the cycles the single port memory 150 is performing a read. Then, on the next cycle the single port memory 150 performs a write to store both the currently received word as well as the buffered word stored in the register 135. The count 125 also controls a mux 115 to ensure the write address 105 is input into the single port memory 150 when performing the write, but the read address 110 is input when performing a read. Further, these addresses 105, 110 are divided by 2 (e.g., by performing a bit shift operation) using a divider 130 since the single port memory 150 has half the memory space as the address space of the multi-port system 100 and stores two words at each memory location.

When performing a read, the count 125 controls the mux 120 so that a "0" is provided to the single port memory 150, instructing it to output the data stored at the memory location of the read address 110 (divided by two) using a read data port (RDATA). In response, the single port memory 150 outputs both of the words stored at this memory address. However, rather than providing both of these words to the requesting entity, the memory system 100 outputs only one of the words using the mux 145 while the other word is stored in the register 140. Thus, when the count 125 causes the single port memory 150 to perform a write in the next clock cycle, the count 125 also instructs the mux 145 to output the data stored in the register 140, thereby outputting the second word that was retrieved during the previous read cycle. Thus, the register 140 pre-buffers data that the requesting entity is expected to want in the next clock cycle. Thus, memory system 100 can perform the function of a dual port memory for any application where the access pattern for a given port (e.g., the read and write ports of the single port memory 150) is sequential. Example functions include streaming fast Fourier transforms (FFTs) and Peak Cancellation-Crest Factor Reduction (PC-CFR).

Although not shown, buffer control logic may be disposed around the memory system 100 to provide addresses and interface control logic. From the perspective of an external entity, the memory system 100 functions the same as a normal dual port memory with the only criteria that the addresses for the two words being written into, or read from, the memory system 100 are contiguous. It is also important to ensure that there are sufficient clock cycles between the write of data to a particular address and its read from that address to ensure data is committed to memory before it is read.

Figure 2:
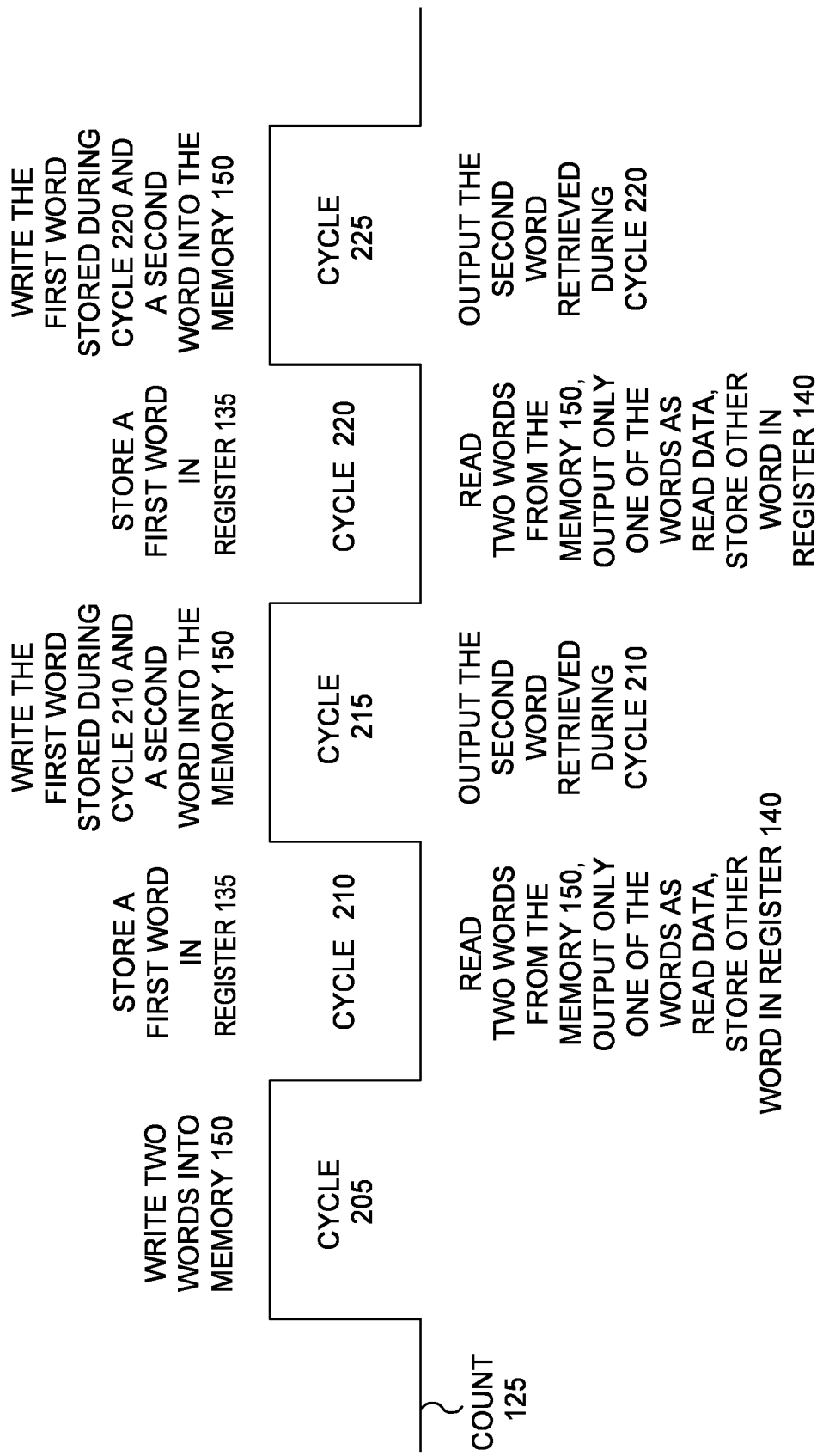
FIG. 2 is a timing diagram for performing read and writes in parallel using a single port memory, according to an example.

FIG. 2 is a timing diagram of the count 125 in FIG. 1 for performing read and writes in parallel using a single port memory, according to an example. For clarity, FIG. 2 is discussed in tandem with the memory system 100 illustrated in FIG. 1. In one embodiment, on startup, the count 125 instructs the memory system 100 in FIG. 1 to be in a read mode. During this read operation, a word of write data is transferred to the register 135. FIG. 2 then begins at cycle 205 where the count 125 instructs the memory system 100 to perform a write during which two words are written into the single port memory 150. That is, the memory system 100 writes both the write data word received during the previous read operation and the currently received word into the memory 150 at the same address location.

At cycle 210, the count 125 instructs the memory system 100 to perform a read into the single port memory 150 where two words are read from the memory 150; however, the memory system 100 outputs only one of those words as read data 155 during the cycle 210 while the other retrieved word is stored (or buffered) in the register).

In parallel to these actions, during cycle 210 the memory system also stores a first word of write data into the register 135. Thus, to the perspective of external circuitry, the memory system 100 appears to have read one word out of memory, and stored another word of write data into memory during the cycle 210. However, in fact the memory system 100 has read two words from the single port memory 150, output one of those words to the requesting entity, buffered the other word read from the memory 150, and also buffered the word of write data.

At cycle 215, the count instructs the memory system 100 to write the first word of write data buffered during the cycle 210 and a second word of write data which is currently received at the memory system 100 into the single port memory 150. Like cycle 205, these two words of write data are stored at the same memory address.

In parallel with performing the write operation on the single port memory 150, the memory system also outputs the second word retrieved from the memory 150 during the previous cycle 210. That is, the count 125 controls the mux 145 such that the word of read data that was buffered in the register 140 is now output as read data 155. Thus, to the perspective of outside circuitry, the memory system 100 has performed another read and write in parallel, when in fact the system 100 has written two words in the single port memory 150 and output the buffered word of read data that was retrieved in the previous cycle 210.

At cycle 220, the count 125 again instructs the memory system 100 to perform a read into the single port memory 150 where two words are read from the memory 150; however, the memory system 100 outputs only one of those words as read data 155 during the cycle 210 while the other retrieved word is stored (or buffered) in the register 140.

In parallel to these actions, the memory system 100 stores a first word of write data into the register 135. Thus, to the perspective of external circuitry, the memory system 100 appears to have read one word out of memory, and stored another word of write data into memory during cycle 220. However, the memory system 100 has in fact read two words from the single port memory 150, output one of those words to the requesting entity, buffered the other word read from the memory 150, and also buffered the word of write data.

At cycle 225, the count 125 again instructs the memory system 100 to write the first word of write data buffered during the cycle 220 and a second word of write data which is currently received at the memory system 100 into the single port memory 150. These two words of write data are stored at the same memory address.

In parallel with performing the write operation on the single port memory 150, the memory system 100 also outputs the second word retrieved from the memory 150 during the previous cycle 220. Thus, to the perspective of outside circuitry, the memory system 100 has performed another read and write in parallel, when in fact the system 100 has written two words in the single port memory 150 and outputted the buffered word of read data that was retrieved in the previous cycle 220.

In this manner, the count 125 can continue to increment between read and write cycles to perform either a 2-word read or 2-word write using the single port memory 150 during each cycle. However, to other circuitry in the IC, the memory system 100 appears to perform 1R and 1W in parallel, like a dual port memory.

Figure 3:
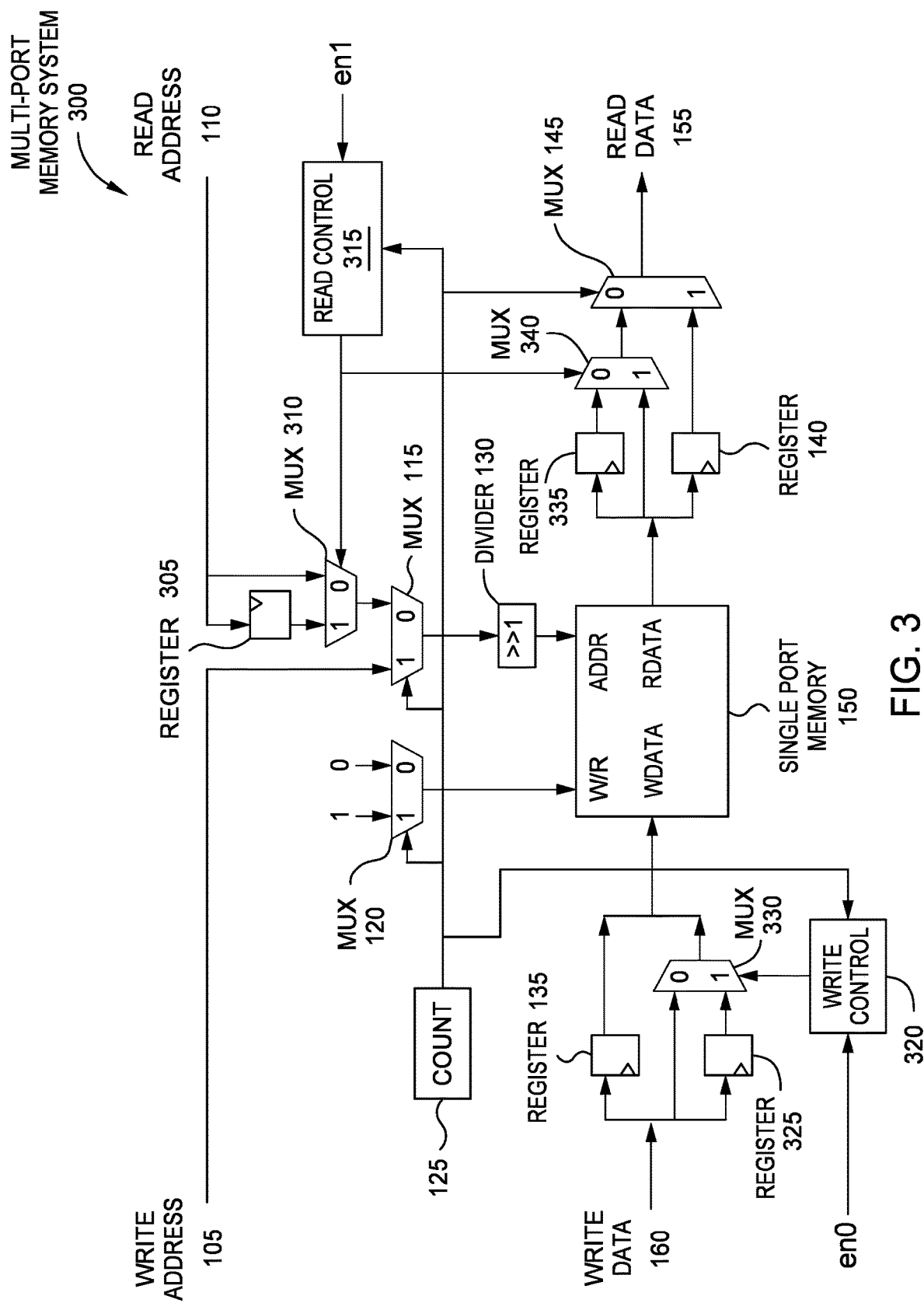
FIG. 3 is a diagram of a multi-port memory system implemented using a single port memory, according to an example.

FIG. 3 is a diagram of a multi-port memory system 300 implemented using a single port memory 150, according to an example. Some FFT applications require the memory system 300 be able to start and stop a write operation on an arbitrary cycle. The memory system 100 in FIG. 1 is unable to do this since it assumes every write stores two data words. However, the memory system 300 in FIG. 3 enables arbitrarily starting and stopping of a write using a write control 320 and a read control 315. Notably, FIG. 3 does not show the ability to arbitrarily stop a read operation, but that can be performed by adding a FIFO on the output of the memory system 100 to hold read data.

FIG. 3 include many of the same components as in FIG. 1 where the same reference numbers are used. These components function in the same way as described above, and thus are not discussed in detail here.

For arbitrary start of a read, the memory system 300 allows the access of the single port memory 150 to be misaligned with the read/write access control performed by the count 125. That is, should the read enable (en1) go high when the memory system 300 is doing a write into the single port memory 150, then the system 300 delays the read access by one cycle. This is done by buffering the read address into a register 305 on the input, and then read the memory on the following cycle using the signal generated by the read control 315 (when the count 125 instructs the system 300 to perform a read of the single port memory 150). However, this delays the read data on the output (i.e., the read data 155).

If the FFT application requires fixed latency, then this delay is accommodated by adding a second register 335 to the read data output. Now both words of the memory output data are captured and then output on the following two cycles. If the read access is aligned (e.g., an arbitrary start is not performed), then the read address is not delayed, and the second register 335 is used to delay the output to give a consistent extra cycle delay. In this manner, the memory system 300 provides a delay from either the address being stored in the register 305 or the data output being stored in the register 335. Stated differently, there is always an additional delay either at the input or output, resulting in fixed delay from input address to output data. As an example, if memory reads when count is 1, then read control 315 generates 1 when en1 transitions to 1 when count=0. This persists until en1=0. This causes the mux 310 to select the register 305, and on the read output select the memory output path without the read data output register 335 using the mux 340.

For arbitrary start of a write, the write side of the system 300 provides an additional buffer (e.g., register 325) on the input that allows data to be buffered if count=1. For arbitrary stop of a write, then both words can be written, irrespective of whether the second item of data has been input to ensure that the first item data is committed to memory. On re-start of a write, the second word can be written along with the previous word stored in the register 135, This avoids the need to have separate write enables on memory although the use of separate write enables is an alternative approach.

Figure 4:
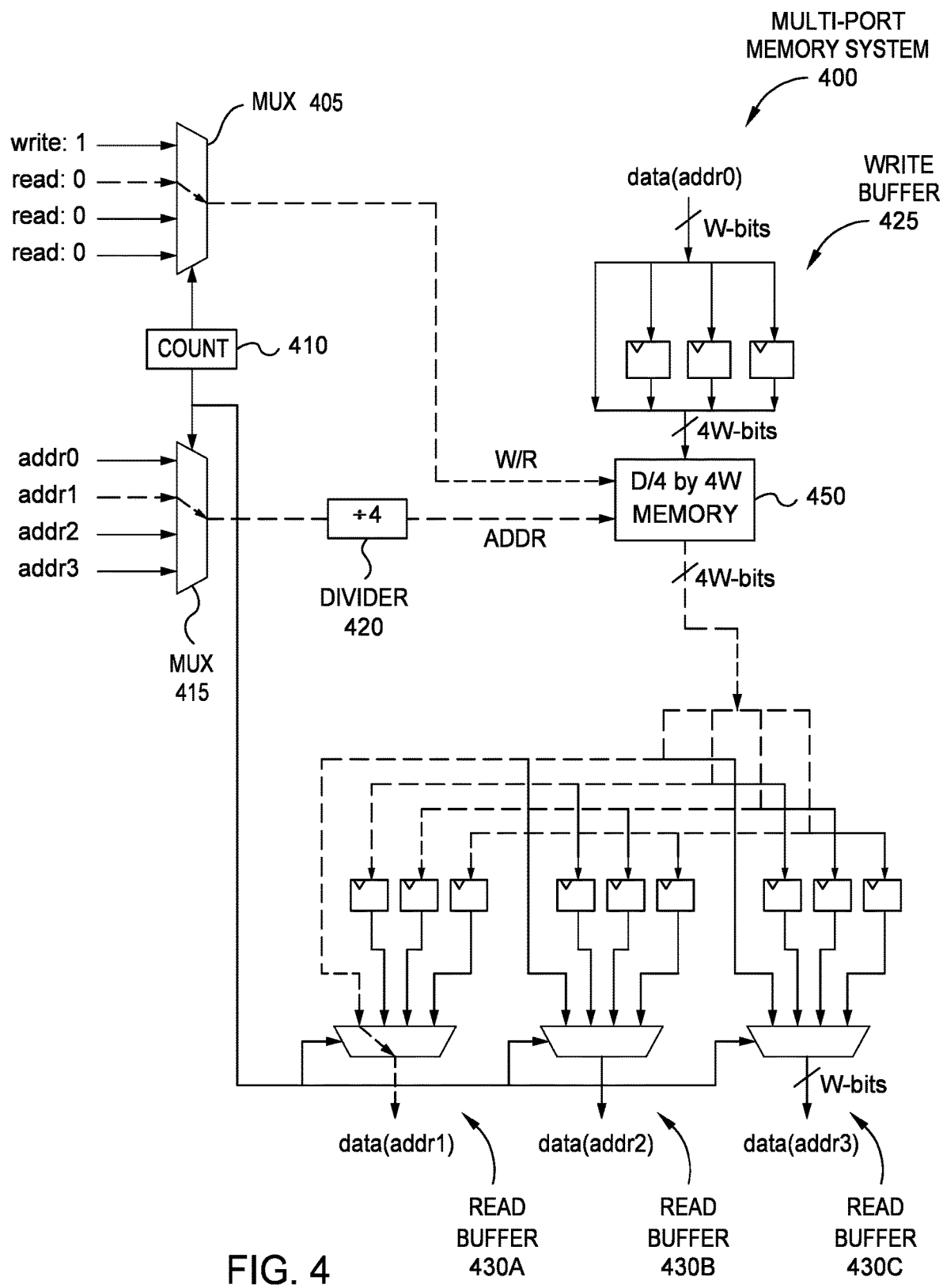
FIG. 4 is a diagram of a 1W3R memory system implemented using a single port memory, according to an example.

FIG. 4 is a diagram of a 1W3R memory system 440 implemented using a single port memory 450, according to an example. That is, to the perspective of an external entity, the memory system 440 performs one write and three reads in parallel but only contains the single port memory 450 that can perform either a read or a write at any given time. In this example, the single port memory 450 has a depth that is data word size divided by 4 (W/4) and a width that is four times the data word size (W*4). Thus, each time the memory system 400 writes to the single port memory 450, it stores four data words at the same memory address, and each time it reads from the memory 450 it retrieves four data words.

The memory system 400 includes a mux 405 that is controlled by the count 410 (which in this case may be a two bit count) that cycles through one write and three reads. That is, during a first cycle, the mux 405 outputs the write command, but for the next three subsequent cycles, the mux 405 outputs the read command. Thus, over four cycles, the single port memory 450 performs one write and three reads even though to the external world it appears that the memory system 400 performs one write and three reads every cycle.

The count 410 also controls a mux 415 which passes the appropriate write address (i.e., addr0) and read addresses (i.e., addrs1-3) to the single port memory 450. These addresses are divided by four by the divider 420 since the address space of the memory 450 is divided by four.

A write buffer 425 prepares to write four data words into the single port memory 450 during each write cycle (which occurs every fourth clock cycle). Again, because the outside circuitry assumes the memory system 400 performs a write every cycle, a requesting entity transmits a data word to the write buffer 425 each cycle. However, instead of performing a write into the memory 450 each cycle, the write buffer 425 stores, in three registers, the three data words received during the cycles when the memory 450 performs reads. When the mux 405 outputs the write command, the single port memory 450 receives the data stored in the registers during the previous three read cycles, along with the currently received write data word, and writes the four data words into the same memory address. Thus, to the outside world, it appears the memory system 400 writes a data word into memory every cycle when in fact it writes into the memory 450 once every four cycles. Further, it is assumed that the first address in the sequence of four words is aligned (i.e., the first 2 LSBs are set to zero).

The memory system 400 includes three read buffers 430 for storing the four data words read from the single port memory 450 during each of three sequential read operations. For example, during a first read operation, four data words are read from addr1/4 and transmitted to the read buffer 430A, during a second read operation, four data words are read from addr2/4 and transmitted to the read buffer 430B, and during a third read operation, four data words are read from addr3/4 and transmitted to the read buffer 430C.

During every cycle, a data word is read out from each of the buffers 430. That is, the count 410 serves as a control signal for each mux in the read buffers 430A-C so that each mux outputs one of the data words stored in the buffers 430. That is, a vector for a particular address (i.e., the four words stored at each address in the single port memory 150) is buffered in the registers in the read buffers 430 and then presented a word at a time over four cycles to the requesting entity.

For full bandwidth access to memory of one word per cycle, the accesses should be aligned and have continuous addresses. In one embodiment, the accesses are aligned by the first address having 00 as its least significant bits and starting in synchronism with the memory access pattern. However, arbitrary unaligned read access can be supported by reading the associated vector and only outputting words from the vector associated with the word read address given. If the access requests a new vector from the single port memory 150, then the memory system 400 may stall until the requested vector is read from memory. A signal can be provided to the requesting entity to indicate that the current read operation is stalling.

If only one word is requested from a particular vector read from the memory 450, then the maximum data rate is one word every four cycles (or more generally M cycles for an M port memory). If the read is contiguous, but unaligned, then there may be a small stall between first and subsequent vector reads, but after the first unaligned read, the stall will align the read address with the count 410, and the read will be contiguous. But this interruption in read data output can be avoided in a subsequent process by adding a small buffer to the output and delaying the start of data buffer output, in effect moving the interruption to the start of the output sequence as a fixed latency delay.

Arbitrary, unaligned writes can also be supported by employing a word enable during the write operation, which is then only active for words written over the write interface up to the point that the port is committed to the memory 450. In fact, data can be re-written to the word buffers (i.e. the same word address) prior to that commitment.

If error checking and/or correction of the vectors stored in the single port memory 450 is required, then it may not be sufficient to update the memory with just a word write enable, as it is also necessary to update the check-bits associated with the whole vector. However, error checking and correction can be accommodated by converting the write access by that port into a memory read if the data vector is not complete by the time the port write is scheduled by the count 410. Read data can be used directly to augment the write vector, filling in the missing words. If writing a contiguous stream, then this incomplete write will only arise on the first vector, where the write process has started part way through the 4-port sequence. A read-modify-write can be initiated, stalling input sufficiently such that subsequent write will be of a complete vector. As with a read operation, a stall on input of the memory system 400 can be avoided, if necessary, by including a data buffer to absorb any stall as described above in FIG. 3.

Figure 5:
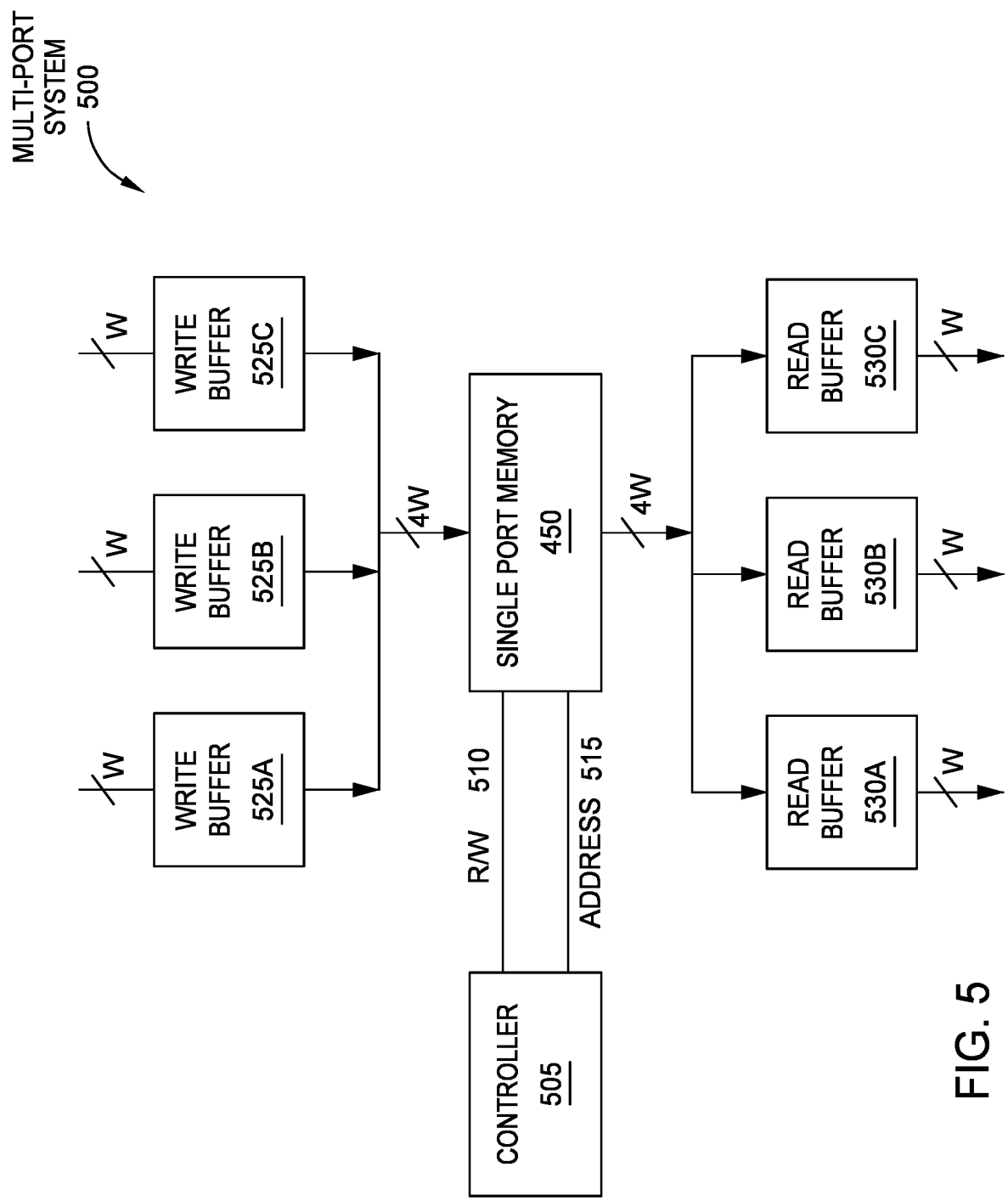
FIG. 5 is a diagram of a configurable multi-port memory system implemented using a single port memory, according to an example.

FIG. 5 is a diagram of a configurable multi-port memory system 500 implemented using a single port memory, according to an example. Generally, FIG. 5 illustrates a multi-port system 500 that is configurable to perform different variations of reads and writes simultaneously using a single port memory 450 as shown in FIG. 4. FIG. 5 is abstracted relative to FIG. 4 to illustrate blocks of circuitry that can be selectively used or not used to provide a desired multi-port memory. That is, the system 500 includes three write registers 520A-C and three read buffers 530A-C which provide flexibility so that a user or application can configure the multi-port system 500 to serve as a 1R/3W memory, a 2R/2W memory, a 3R/1W memory. It is also worth noting that some FPGA applications use read only memories (ROM) from RAM that are initialized by the bitstream (i.e., where not write port is required). In these applications, as well as in an ASIC with ROM, we could use the techniques described herein to share a ROM that only performs reads (e.g., 4R).

The memory system 500 includes a controller 505 which outputs a R/W signal 510 and address signal 515. Like in FIG. 4, the single port memory 450 stores four data words at each address (i.e., the memory 450 has an address space that is a quarter of the depth of the address space of the multi-port system 500 as a whole). When configured as a 1R/3W memory, only one of the read buffers 530 is used while all three of the write buffers 525 would be used. The other two read buffers 530 would be inactive and could be powered off. In that case, the controller 505 ensures that the single port memory performs 1 read and 3 write operations every four clock cycles. During the read cycle, four data words would be read from the single port memory 450 and stored in one of the read buffers 530. That way, during each of the three subsequent write operations the memory 450, the read buffer 530 outputs one of the buffered words.

To write data into the memory 450, during each cycle an external entity provides three data words to the multi-port system 500. When the single port memory 450 performs a read operation, the three write words received during that clock cycle are stored (i.e., buffered) in the write buffers 525 (e.g., one word in each buffer 525). During the next three cycles when the single port memory 450 performs write operations, the three currently received data words, as well as one of the data words stored in the write buffers 525 during the read operation, are written into the single port memory 450. That way, during each of the three write cycles, four data words are written into the same address.

When configured as a 2R/2W memory, two of the read buffers 530 and two of the write buffers 525 are used. The other read and write buffers would be unused and could be powered off. In that case, the controller 505 ensures that the single port memory 450 performs 2 read and 2 write operations every four clock cycles. During the two read cycles, four data words would be read from the single port memory 450 and stored in one of the two used read buffers 530. That way, during each of the two write operations the memory 450, the two read buffer 530 output one of the buffered words.

For a 2R/2W memory, during each cycle an external entity provides two data words to the multi-port system 500. When the single port memory 450 performs a read operation, the two write words received during that clock cycle are stored in the two write buffers 525 (e.g., one word in each buffer 525). During the next two cycles when the single port memory 450 performs write operations, the two currently received data words, as well as two of the data words stored in the two write buffers 525 during the read operations, are written into the single port memory 450. That way, during each of the two write cycles, four data words are written into the same address. However, this assumes the memory is always writing and reading words. In one embodiment, the memory can have the flexibility to miss reads or writes on a particular clock cycle, in which case the memory can perform the writes for the words input prior to the associated port's memory write slot (using word enables to gate them into memory). For reads, the memory reads all words from memory when the associated slot comes about, but only outputs those words which were requested (i.e. the memory system generates a data output valid signal for each word read, that tracks the input read enable but is delayed accordingly).

When configured as a 3R/1W memory, three of the read buffers 530 and only one of the write buffers 525 are used. The two write buffers that are unused could be powered off. In this example, the multi-port system 500 would operate the same as the multi-port system 400 in FIG. 4.

In this manner, the multi-port system 500 includes circuitry to support a variety of different multi-port configurations using the single port memory 450. At one point in a time, a user or application can configure the multi-port system 500 to be a 1R/3W memory but later at a second point in time reconfigure the system 500 to be a 3R/1W memory. Further, the system 500 can support a 1R/W and 3R memory where, for example, the memory is connected to a processor interface capable of performing random reads or writes using one port and still retain the three read ports for contiguous high bandwidth reads.

Figure 6A:
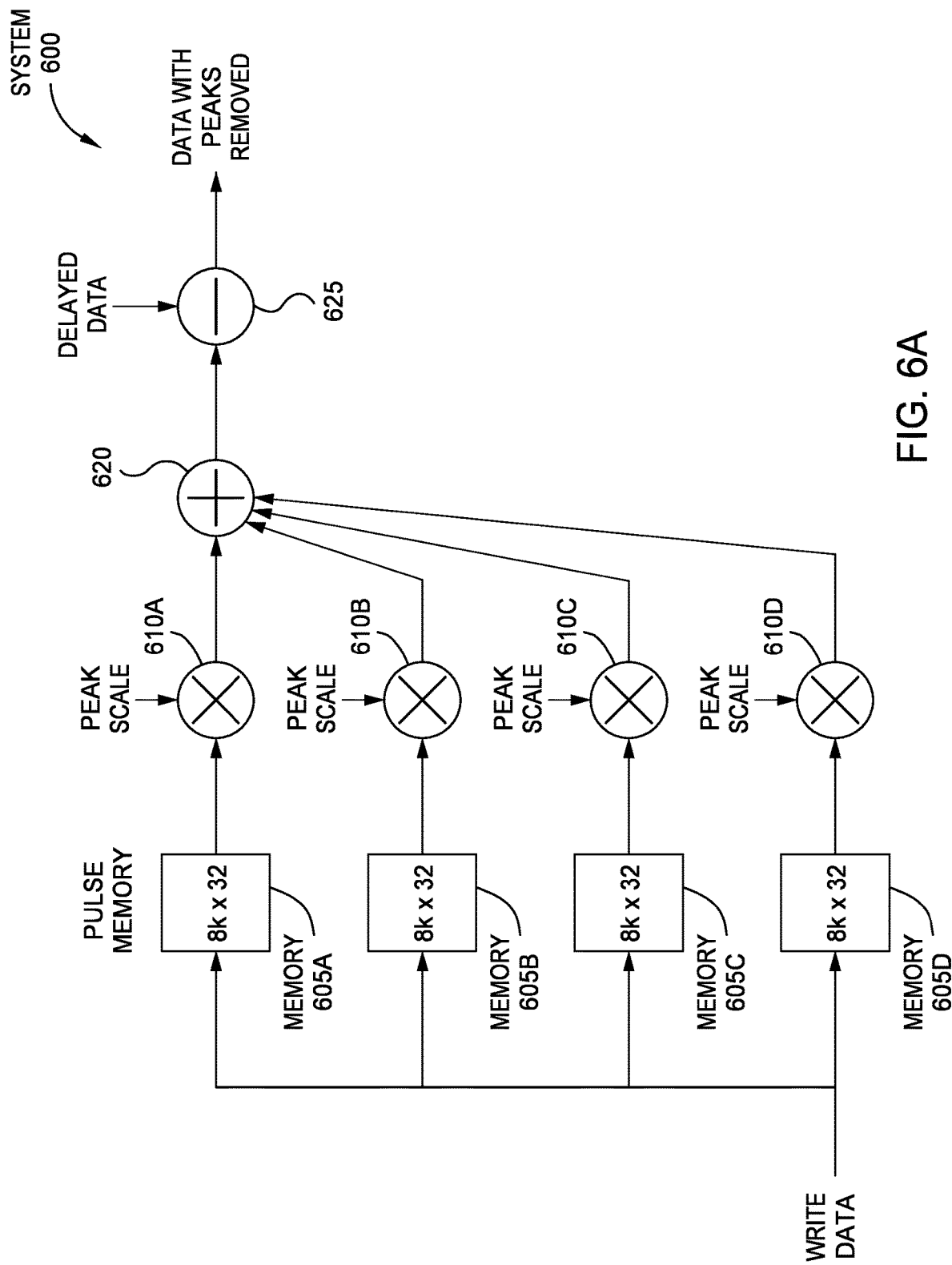
FIGS. 6A and 6B illustrate performing Peak cancellation-Crest Factor Reduction using multi-port memory systems, according to an example.
Figure 6B:
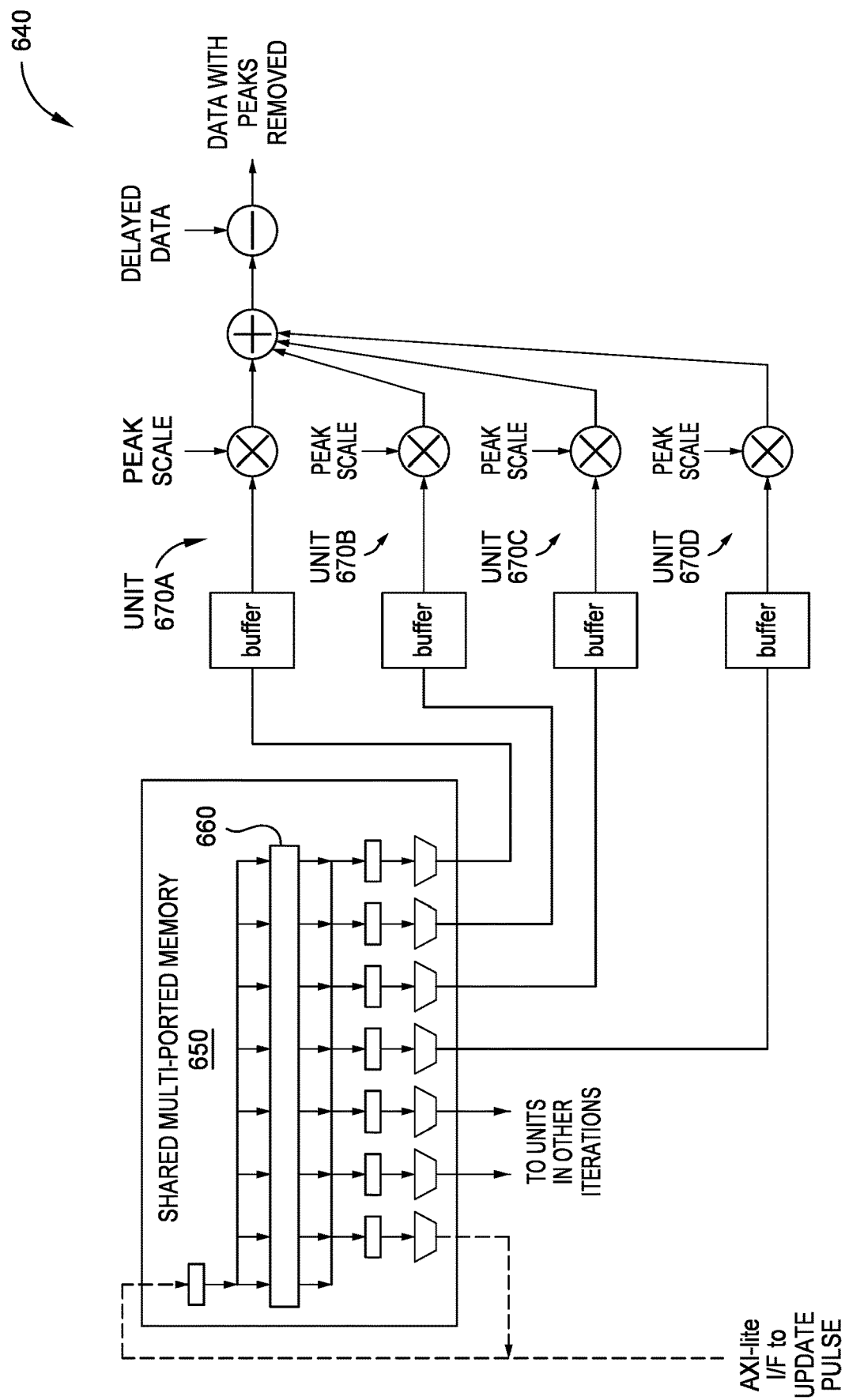

FIGS. 6A and 6B illustrate performing PC-CFR using different multi-port memory systems, according to an example. Specifically, FIG. 6A illustrates performing PC-CFR using multiple multi-port memories 605 while FIG. 6B illustrates performing PC-CFR using a single port memory 650.

The system 600 illustrated in FIG. 6A include four multi-port memories 605, that unlike the embodiments above, can perform at least one read and write in parallel. That is, the multi-port memories 605 have independent read and write address ports so they can perform at least one read and one write in parallel unlike the embodiments above where a multi-port system can be implemented using a single port memory. However, the system 640 in FIG. 6B illustrates performing PC-CFR using a single port memory 660 which can save space and reduce cost.

In a PC-CFR application, the peak to average power of a signal is reduced by removing peaks by subtracting an appropriately scaled pre-defined pulse from the signal. These pre-defined pulses can be stored in the memories 605, and looked up for the canceling the peak by summing the outputs of the multipliers 610. The system 600 includes four pulse cancellation units with associated memories 605. The pulse data readout is aligned with the peak that has been previously detected (by logic not shown) by delaying data by half a pulse length. The pulse is read from the memories 605, scaled by the multipliers 610 using the peak scale values, summed together by the summer 620, and subtracted from the delayed data by the subtractor 625. In this case there are four pulse cancellation units, but in general there may be more or less, applied in multiple iterations, where the latter may be required due to regrowth of peaks elsewhere.

Each memory 605 is dual ported in order to allow the pulse to be updated, and two banks can be implemented to allow an update in parallel with the pulse cancellation operation, with a switch-over of bank at a suitably convenient instant.

However, FIG. 6B illustrates that it is possible to employ the 2-port shared memory described in the previous embodiments to replace the dual-port memories 605 in FIG. 6A with a single ported memory 660. This reduces area and power by replacing a dual-port memory with a single port memory.

Also, by noting that the pulse is the same in each memory 605 in FIG. 6A, it is also possible to reuse the single port memory 660 to make the same memory content available to all pulse cancellation units 670. This reduces the total amount of memory bits by a factor of Q, where Q is the number of pulse cancellation units 670 served by the shared M-ported memory. This can translate to a reduction by a factor of Q in area, although this may be diluted a little by the extra logic to buffer each port and the increase in area-per-bit for memory macros with reduced depth.

Specifically, the system 640 illustrates replacing the separate dual-port memories 605 with a single shared eight port memory 660 where two ports are used to provide AXI-lite read and write, and six ports are for read access by pulse cancellation units. Further, two of the ports can reside in another iteration (not shown). Note that the AXI-lite read and write ports could be replaced by a single read-write port to allow another pulse cancellation unit to be added. The memory aspect ratio has been changed from 8 k by 32-bits to 1 k by 256-bits, which can be realized using 1 or more physical memory macros (e.g., 2 128-bit wide memories).

As a non-limiting example, three eight-port shared multiport memories 650 can replace 18 dual port memories 605 which can provide a ~7× reduction in memory macro area. Since memory is a large proportion of the total area, the total area can be reduced to less than 50% relative to using the memories 605.

This disclosure is not limited to the use-cases outlined above and can be applied to any application where the access pattern of a given port is sequential or consistent. If this condition is met, all of the provided multi-ports are independent from one another and may be used to read or write at will.

In the preceding, reference is made to embodiments presented in this disclosure. However, the scope of the present disclosure is not limited to specific described embodiments. Instead, any combination of the described features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the preceding aspects, features, embodiments and advantages are merely illustrative and are not considered elements or limitations of the appended claims except where explicitly recited in a claim(s).

As will be appreciated by one skilled in the art, the embodiments disclosed herein may be embodied as a system, method or computer program product. Accordingly, aspects may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium is any tangible medium that can contain, or store a program for use by or in connection with an instruction execution system, apparatus or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the users computer and partly on a remote computer or entirely on the remote computer or server. In the latter scenario, the remote computer may be connected to the users computer through any type of network, including a local area network (LAN) or a wide area network (WAN), or the connection may be made to an external computer (for example, through the Internet using an Internet Service Provider).

Aspects of the present disclosure are described below with reference to flowchart illustrations and/or block diagrams of methods, apparatus (systems) and computer program products according to embodiments presented in this disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods, and computer program products according to various examples of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to specific examples, other and further examples may be devised without departing from the basic scope thereof, and the scope thereof is determined by the claims that follow.

What is claimed is:

1. A multi-port memory system, comprising:
   a single port memory capable of performing only one read or one write at a time, wherein a width of the multi-port memory system is less than a width of the single port memory;
   a first memory coupled to a write data port of the single port memory and configured to store a received write data word when the single port memory is performing a read operation; and
   a second memory coupled to a read data port of the single port memory and configured to store a first data word of a plurality of data words read from the single port memory during the read operation,
   wherein an access pattern corresponding to the multi-port memory system is sequential such that memory addresses used to perform read and write operations increment according to a fixed amount.

2. The multi-port memory system of claim 1, wherein, during a write operation, multiple data words are received at the write data port, wherein one of the multiple data words comprises the write data word stored in the first memory during the read operation.

3. The multi-port memory system of claim 1, wherein the single port memory stores multiple data words at each memory location, wherein each of the multiple data words corresponds to a different address in an address space of the multi-port memory system but the multiple data words correspond to a same address in an address space of the single port memory.

4. The multi-port memory system of claim 1, further comprising:
   a multiplexer connected at a first input to the read data port and at a second input to an output of the second memory, wherein the multiplexer is configured to select whether to transmit, as read data, a second data word read from the single port memory during the read operation or transmit the first data word that was previously stored in the second memory.

5. The multi-port memory system of claim 1, wherein the multi-port memory system is configured to start and stop data write on an arbitrary cycle using a write control and a read control, the multi-port memory system comprising:
   a first multiplexer connected between the single port memory and a received read address signal, wherein a selection signal of the first multiplexer is controlled by the read control;
   a third memory coupled to an input of the first multiplexer and configured to store the received read address signal;
   a second multiplexer connected between the write data port and received write data, wherein a selection signal of the second multiplexer is controlled by the write control;
   a fourth memory coupled to an input of the second multiplexer and configured to store at least a portion of the received write data;
   a third multiplexer connected between a read output of the multi-port memory system and the read data port, wherein a selection signal of the third multiplexer is controlled by the read control; and
   a fifth memory coupled to an input of the third multiplexer and configured to store at least a portion of read data provided by the read data port.

6. The multi-port memory system of claim 1, further comprising:
   a plurality of read buffers coupled to the read data port, each of the plurality of read buffers configured to store multiple data words received from the single port memory during a respective read operation, wherein the plurality of read buffers each outputs a respective data word during each read and write operation performed by the single port memory,
   wherein, to the perspective of an external entity, the multi-port memory system performs multiple read operations in parallel.

7. The multi-port memory system of claim 1, further comprising:
   a plurality of write buffers coupled to the write data port, each of the plurality of write buffers configured to buffer multiple write data words when the single port memory performs a read operation, wherein at least one of the plurality of write buffers outputs one of the buffered multiple write data words to the single port memory when performing a write operation,
   wherein, to the perspective of an external entity, the multi-port memory system performs multiple write operations in parallel.

8. The multi-port memory system of claim 1, further comprising:
   a plurality of read buffers coupled to the read data port; and
   a plurality of write buffers coupled to the write data port, wherein the multi-port memory system is configurable to function as one of a 1 R/xW, yR/xW, yR/1 W, xW, or yR memory by selectively using a subset of the plurality of read and write buffers, wherein x and y are integer values greater than one.

9. The multi-port memory system of claim 8, wherein the plurality of read buffers and the plurality of write buffers are dynamically selectable so that the multi-port memory system can switch from one of a 1 R/xW, yR/xW, yR/1 W, xW, or yR memory to performing a different number of reads or writes in parallel.

10. The multi-port memory system of claim 1, wherein the single port memory stores pulse data for Peak Cancellation-Crest Factor Reduction (PC-CFR), wherein the multi-port memory system comprises:
    a plurality of pulse cancellation units coupled to the single port memory using ports.

11. A method for performing read and writes in parallel using a single port memory, comprising:
    providing a single port memory in a multi-port memory system, wherein the single port memory is capable of performing only one read or one write at a time, wherein a width of the multi-port memory system is less than a width of the single port memory;

receiving, at a first memory coupled to a write data port of the single port memory, a write data word when the single port memory is performing a read operation; and storing, at a second memory coupled to a read data port of the single port memory, a first data word of a plurality of data words read from the single port memory during the read operation, wherein an access pattern corresponding to the multi-port memory system is sequential such that memory addresses used to perform read and write operations increment according to a fixed amount.

12. The method of claim 11, wherein, to a perspective of an external entity, the multi-port memory system performs at least one of (i) at least one read and at least one write operation in parallel or (ii) multiple reads or multiple writes in parallel.

13. The method of claim 11, wherein an address space of the single port memory is half or less than the address space of the multi-port memory system.

14. The method of claim 13, further comprising:
dividing write and read addresses used to perform read and write operations in the single port memory by an integer value that is greater than one and is a power of two.

15. The method of claim 11, further comprising:
starting and stopping a write operation on an arbitrary cycle in the single port memory by adding a delay to the write data port and the read data port of the single port memory.

16. The method of claim 15, further comprising:
storing a received read address in a register; and
selecting at least one of the received read address stored in the register or a currently received read address to perform a read operation in the single port memory in response to starting or stopping a write operation on an arbitrary cycle.

17. The method of claim 11, further comprising:
configuring, at a first time, the single port memory to function as one of a 1 R/xW, yR/xW, yR/1 W, xW, or yR multi-port memory by selectively using a subset of a plurality of read buffers and a plurality of write buffers, wherein x and y are integer values greater than one.

18. The method of claim 17, further comprising:
reconfiguring, at a second time after the first time, the single port memory to function as a different multi-port memory by selectively using a different subset of the plurality of read and write buffers.

* * * * *